(12) United States Patent
Lin et al.

(10) Patent No.: US 8,754,473 B2
(45) Date of Patent: Jun. 17, 2014

(54) POWER TRANSISTOR DEVICE

(71) Applicant: Anpec Electronics Corporation, Hsin-Chu (TW)

(72) Inventors: Yung-Fa Lin, Hsinchu (TW); Shou-Yi Hsu, Hsinchu County (TW); Meng-Wei Wu, Hsinchu (TW); Chia-Hao Chang, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/934,218

(22) Filed: Jul. 2, 2013

(65) Prior Publication Data

US 2013/0292760 A1 Nov. 7, 2013

Related U.S. Application Data (62) Division of application No. 13/533,957, filed on Jun. 26, 2012, now Pat. No. 8,524,559.

(30) Foreign Application Priority Data

Oct. 31, 2011 (TW) .............................. 100139574 A (51) Int. Cl.
*H01L 29/66* (2006.01)
(52) U.S. Cl.
USPC .................... 257/332; 257/330; 257/E29.201
(58) Field of Classification Search
CPC ............ H01L 29/7813; H01L 29/7827; H01L 29/66734; H01L 29/78; H01L 29/41766; H01L 29/1095; H01L 29/7811; H01L 29/42368; H01L 29/407; H01L 29/4236; H01L 29/66666; H01L 29/66727; H01L 29/017; H01L 29/0696; H01L 29/0634; H01L 29/0878; H01L 29/04; H01L 29/06
USPC ................................. 257/330, 332, E29.201
See application file for complete search history.

(56) References Cited

U.S. PATENT DOCUMENTS

| 7,084,043 | B2 * | 8/2006 | Birner et al. .................. 438/408 |
| 7,528,035 | B2 | 5/2009 | Cheng |
| 8,329,538 | B2 | 12/2012 | Pan |
| 2004/0197965 | A1 | 10/2004 | Birner |
| 2005/0059214 | A1 | 3/2005 | Cheng |

* cited by examiner

*Primary Examiner* — Michelle Mandala
(74) *Attorney, Agent, or Firm* — Winston Hsu; Scott Margo (57) ABSTRACT

The present invention provides a power transistor device including a substrate, an epitaxial layer, a dopant source layer, a doped drain region, a first insulating layer, a gate structure, a second insulating layer, a doped source region, and a metal layer. The substrate, the doped drain region, and the doped source region have a first conductive type, while the epitaxial layer has a second conductive type. The epitaxial layer is formed on the substrate and has at least one through hole through the epitaxial layer. The first insulating layer, the gate structure, and the second insulating layer are formed sequentially on the substrate in the through hole. The doped drain region and doped source region are formed in the epitaxial layer at one side of the through hole. The metal layer is formed on the epitaxial layer and extends into the through hole to contact the doped source region.

4 Claims, 13 Drawing Sheets

POWER TRANSISTOR DEVICE

CROSS REFERENCE TO RELATED APPLICATIONS

This application is a divisional application of and claims the benefit of U.S. patent application Ser. No. 13/533,957, filed Jun. 26, 2012 now U.S. Pat. No. 8,524,559.

BACKGROUND OF THE INVENTION

1. Field of the Invention

The present invention relates generally to a power transistor device and a manufacturing method thereof, more particularly, to a trench type power transistor device with a super junction and a manufacturing method thereof 2. Description of the Prior Art In power transistor devices, the ON resistance (RDS(on)) between the drain and the source is proportional to the power consumption of the device, so an effective way to reduce the power consumption of the power transistor device is to lower the RDS(on). In power transistor devices, the resistance provided by the epitaxial layer used for withstanding high voltage is the main contribution to the RDS(on). Although increasing the doping concentration of the conductive material in the epitaxial layer can reduce the resistance, the breakdown voltage of the epitaxial layer will also be lowered, thereby degrading the capacity of the power transistor device to withstand high voltages. For this reason, a power transistor device with a super junction which has high voltage withstanding ability and low ON resistance has been developed in the industry.

Figure 1:
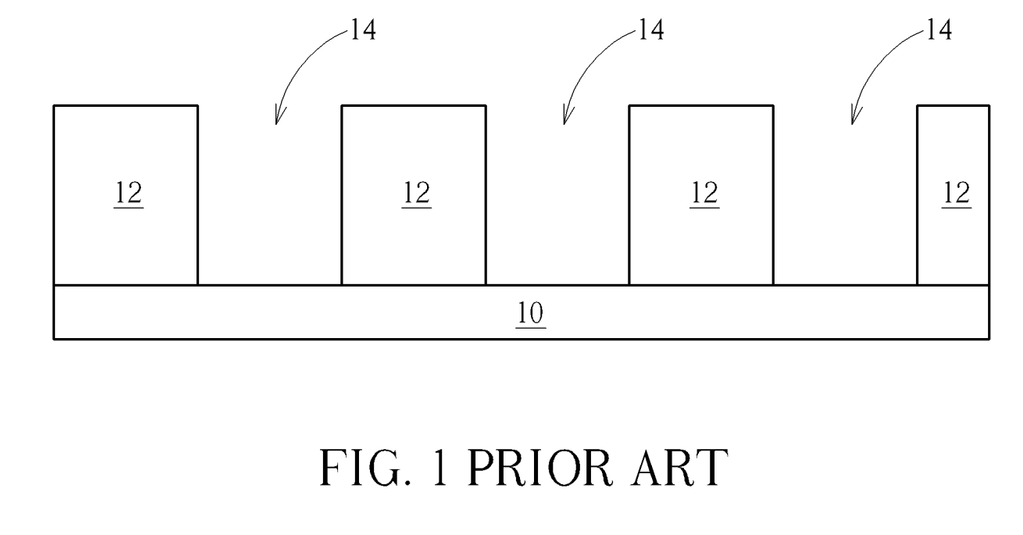
FIGS. 1-6 are schematic views illustrating the manufacturing method of a conventional power transistor device with a super junction.
Figure 2:
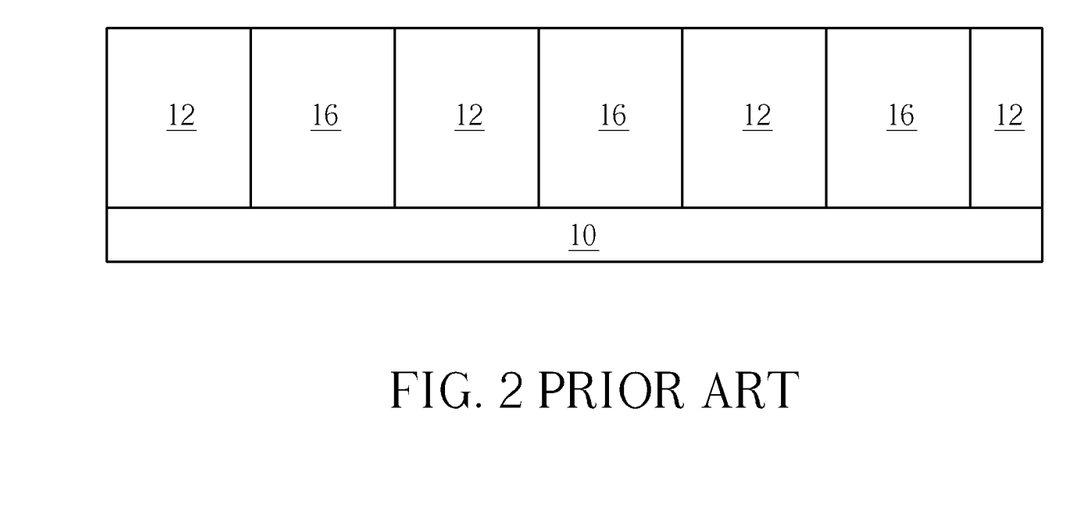
Figure 3:
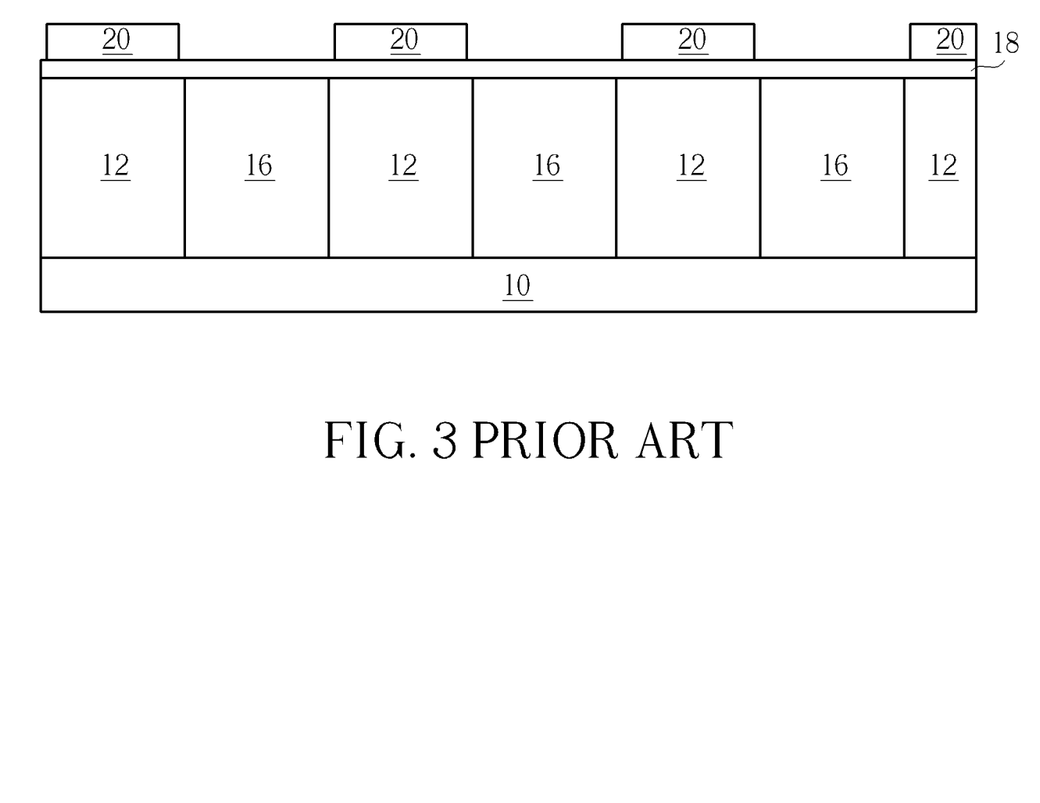
Figure 4:
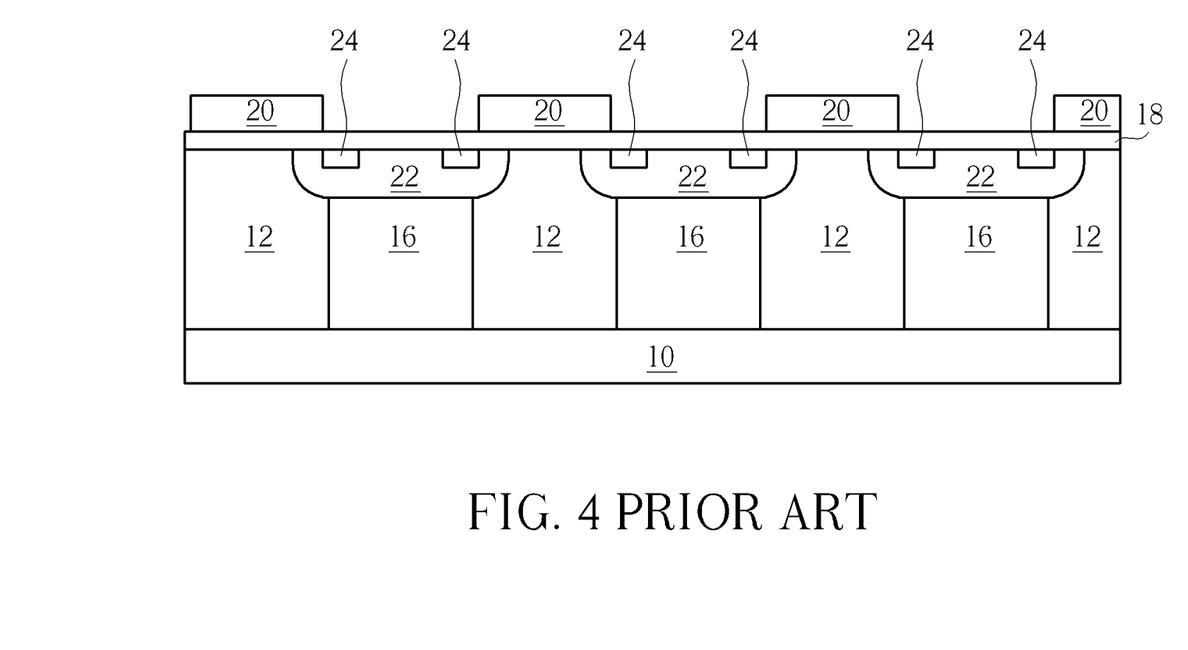
Figure 5:
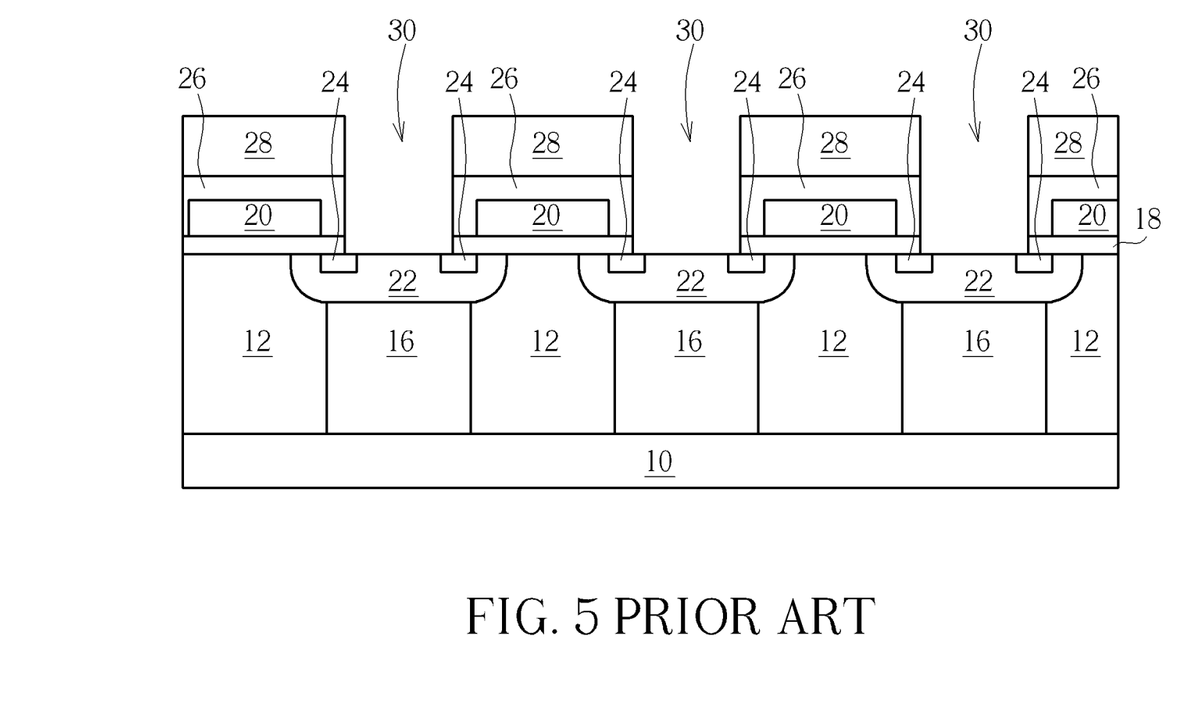
Figure 6:
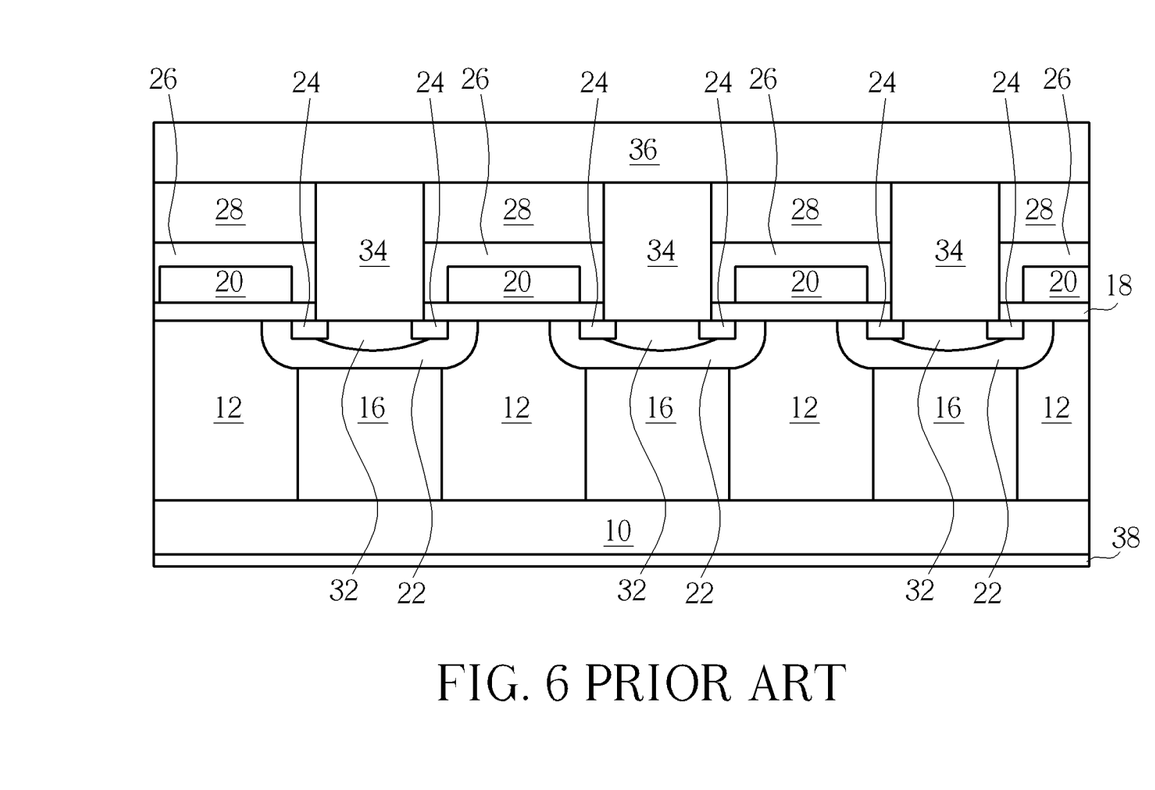

Please refer to FIGS. 1-6, which are schematic views illustrating a manufacturing method of a conventional power transistor device with a super junction. First, as shown in FIG. 1, an N-type epitaxial layer 12 is deposited on an N-type substrate 10, and then an etching process is performed with a first photomask to etch a plurality of trenches 14 on the N-type epitaxial layer 12. As shown in FIG. 2, a P-type epitaxial layer 16 is then deposited in each trench 14 so that the upper surface of the P-type epitaxial layer 16 is leveled with the upper surface of the N-type epitaxial layer 12. Then, as shown in FIG. 3, an insulating layer 18 is covered on the N-type epitaxial layer 12 and the P-type epitaxial layer 16. Afterwards, a plurality of gate electrodes 20 are formed on the insulating layer 18 through utilizing a second photomask, wherein the gate electrodes 20 are disposed above the N-type epitaxial layer 12. As shown in FIG. 4, the gate electrode 20 serves as a mask, and a P-type ion implantation process is performed on the P-type epitaxial layer 16 and the N-type epitaxial layer 12 to form a P-type doped base region 22 in the P-type epitaxial layer 16 and N-type epitaxial layer 12. A thermal drive-in process is then performed to extend the P-type doped base region 22 to be overlapped with gate electrodes 20. Afterwards, an N-type ion implantation process is performed by using a third photomask to form two N-type doped source regions 24 in each P-type doped base region 22 adjacent to the gate electrodes 20. Then, as shown in FIG. 5, a dielectric layer 26 and a BPSG (boro-phospho-silicate-glass) layer 28 is covered on the gate electrodes 20 and the insulating layer 18. A photolithographic process and an etching process are then performed on the dielectric layer 26, the BPSG layer 28 and the insulating layer 18 on each P-type doped base region 22 to form a contact hole 30 on each P-type doped base region 22 and expose the P-type doped base regions 22. Then, as shown in FIG. 6, a P-type ion implantation process is performed to form a P-type doped contact region 32 in each P-type doped base region 22. A thermal drive-in process is performed to drive the P-type doped contact region 32 to contact each N-type doped source region 24. Finally, a contact plug 34 is filled into each contact hole 30 and a source metal layer 36 is formed on the BPSG layers 28 and the contact plugs 34. A drain metal layer 38 is formed under the N-type substrate 10. The N-type epitaxial layer 12 and the P-type epitaxial layer 16 constitute a vertical P-N junction, i.e. the so-called super junction. According to the above description, the conventional manufacturing method of the power transistor device needs up to four photomasks to define the patterns of different devices.

Although there are still other methods, such as performing multiple epitaxial processes and ion implantation processes to form super junctions in the industry, the cost and complexity for manufacturing the power transistor device will be significantly increased when the number of the photomasks used in the process is increased. In view of this matter, the main objective of the industry in the current stage is to lower the number of necessary photomasks and the complexity for manufacturing the power transistor devices.

SUMMARY OF THE INVENTION

One purpose of the present invention is to provide a power transistor device and a manufacturing method thereof in order to lower the number of the necessary photomasks and the complexity for manufacturing of a power transistor device.

According to a preferred embodiment, the present invention provides a power transistor device, which includes a substrate, an epitaxial layer, a doped base region, a dopant source layer, a doped drain region, a first insulating layer, a gate structure, a second insulating layer, a doped source region, and a metal layer. The substrate has a first conductive type. The epitaxial layer is on the substrate and has at least one through hole through the epitaxial layer, wherein the epitaxial layer has a second conductive type. The doped base region is in the epitaxial layer and has a second conductive type. The dopant source layer is in the through hole. The doped drain region of first conductive type is in the epitaxial layer at one side of the dopant source layer and contacts the substrate. A first insulating layer is on the dopant source layer in the through hole. The gate structure is on the first insulating layer in the through hole. The second insulating layer is on the gate structure in the through hole. The doped source region is in the doped base region on the doped drain region and has the first conductive type, wherein the gate structure is between the doped source region and the doped drain region and contacts the doped base region. The metal layer is on the epitaxial layer and extends into the through hole to contact with the doped source region.

According to a preferred embodiment, the present invention provides a manufacturing method of the power transistor device comprising the steps of first providing a substrate of a first conductive type, forming an epitaxial layer of a second conductive type different from the first conductive type on the substrate, forming a doped base region of the second conductive type in the epitaxial layer, forming at least one through hole in the epitaxial layer to expose the substrate, filling a first dopant source layer having a plurality of first dopants of the first conductive type in the through hole, forming a first insulating layer on the first dopant source layer in the through hole, forming a gate structure in the first insulating layer and a second insulating layer on the gate structure, forming a second dopant source layer having a plurality of second dopants of the first conductive type on the second insulating layer, forming a doped source region in the doped base region and a doped drain region in the epitaxial layer, removing the second dopant source layer in the through hole, and forming a metal layer on the epitaxial layer and filling up the through hole.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
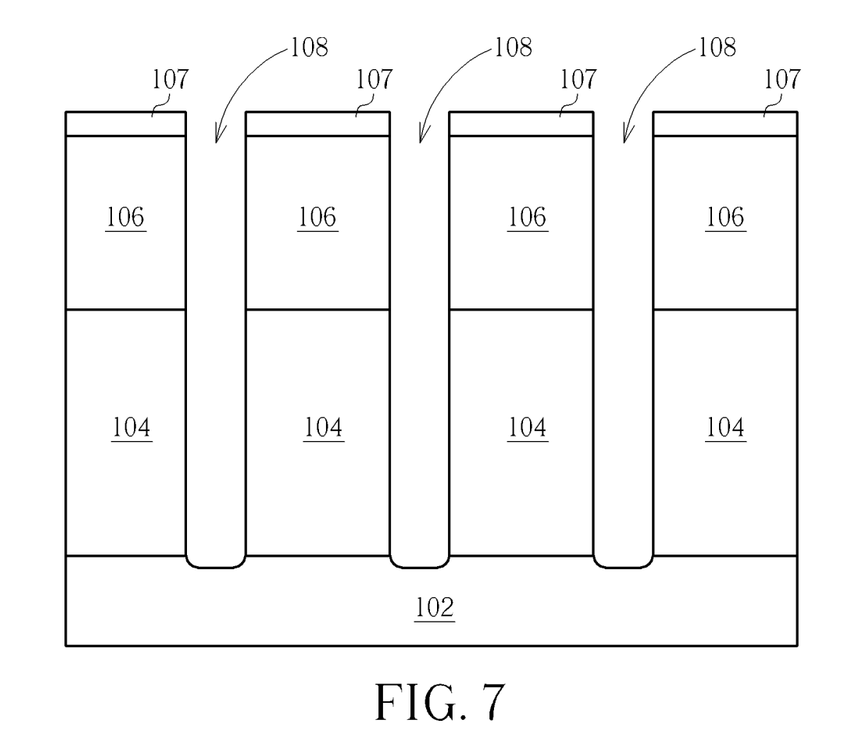
FIGS. 7-12 are schematic views illustrating the manufacturing method of a power transistor device in accordance with the first embodiment of present invention.

Please refer to FIGS. 7-12, which are schematic views illustrating the manufacturing method of a power transistor device in accordance with the first embodiment of present invention. First, as shown in FIG. 7, a substrate 102 of a first conductive type having an active device region and a peripheral region is provided. The following description will take the power transistor device in the active device region as an example to be manufactured. An epitaxial process is then carried out to form an epitaxial layer 104 having a second conductive type different from the first conductive type on the substrate 102. Then, a first ion implantation process of the second conductive type and a first thermal drive-in process are performed to form a doped base region 106 of the second conductive type in the epitaxial layer 104. Then, a pad layer 107 is formed on the doped base region 106. The pad layer 107 may be made of materials, such as silicon dioxide ($SiO_2$), silicon nitride ($Si_3N_4$), or a combination thereof. A hard mask layer (not shown), such as silica layer, is then formed on the surface of the pad layer 107 by a deposition process. Afterwards, a photolithographic process and an etching process with a photomask are performed to form a plurality of through holes 108 in the doped base region 106, the epitaxial layer 104, and the pad layer 107. The through hole 108 penetrates through the epitaxial layer 104 and the pad layer 107 to expose the underlying substrate 102. The hard mask layer is then removed. In this embodiment, the first conductive type is N type, and the second conductive type is P type, but not limited thereto. The first conductive type and the second conductive type may be interchanged. Besides, the number of the through holes 108 of present invention is not limited to be a plurality, and may be only one. The number of the through holes 108 may be correspondingly adjusted depending on the device properties, such as the required voltage withstanding degree or the value of the turn-on current for power transistor device.

Figure 8:
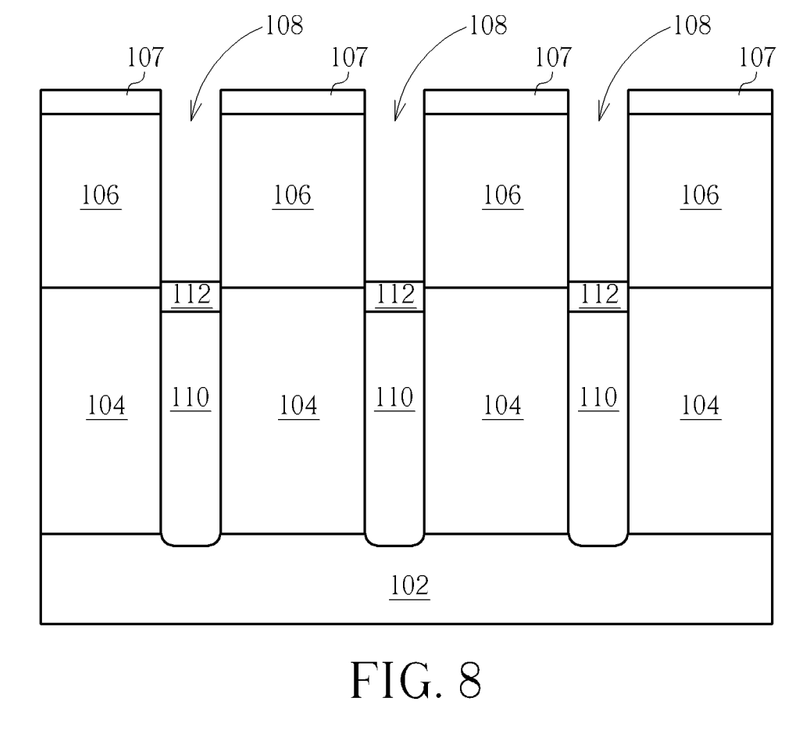

Then, as shown in FIG. 8, a first deposition process is performed to form a first dopant source layer 110 on the P-type epitaxial layer 104 and N-type substrate 102 and filling up each through hole 108. A first polishing and etching back process is then performed to remove the first dopant source layer 110 outside of the through holes 108 and a part of the first dopant source layer 110 inside each through holes 108, so that the upper surface of the first dopant source layer 110 in the through holes 108 does not contact the P-type doped base region 106. That is, during this stage, the first dopant source layer 110 is slightly lower than the bottom of P-type doped base region 106. A second deposition process is then performed to deposit an oxide layer on the P-type epitaxial layer 104 and the first dopant source layer 110 and filling up the through holes. Then, a second polishing and etching back process is performed to remove the oxide layer outside the through holes 108 and a part of the oxide layer inside each through hole 108, so that the upper surface of the pad layer 107 and a part of the sidewall of each through hole 108 are exposed and a first insulating layer 112 is formed on the first dopant source layer 110 in the through holes 108. In this embodiment, the first dopant source layer 110 includes a plurality of N-type first dopants and the material used to form the first dopant source layer 110 may include arsenic silicate glass (ASG) or phosphor silicate glass (PSG), but is not limited thereto. Furthermore, the material used to form the first insulating layer 112 is not limited to oxide. It may be any insulating material, such as nitride. Besides, the upper surface of the first insulating layer 112 in the present embodiment is, but not limited thereto, lower than the upper surface of the P-type epitaxial layer 104 and higher than the bottom of P-type doped base region 106, so that the gate structure 114 to be formed in following processes may contact the P-type doped base region 106.

Figure 9:
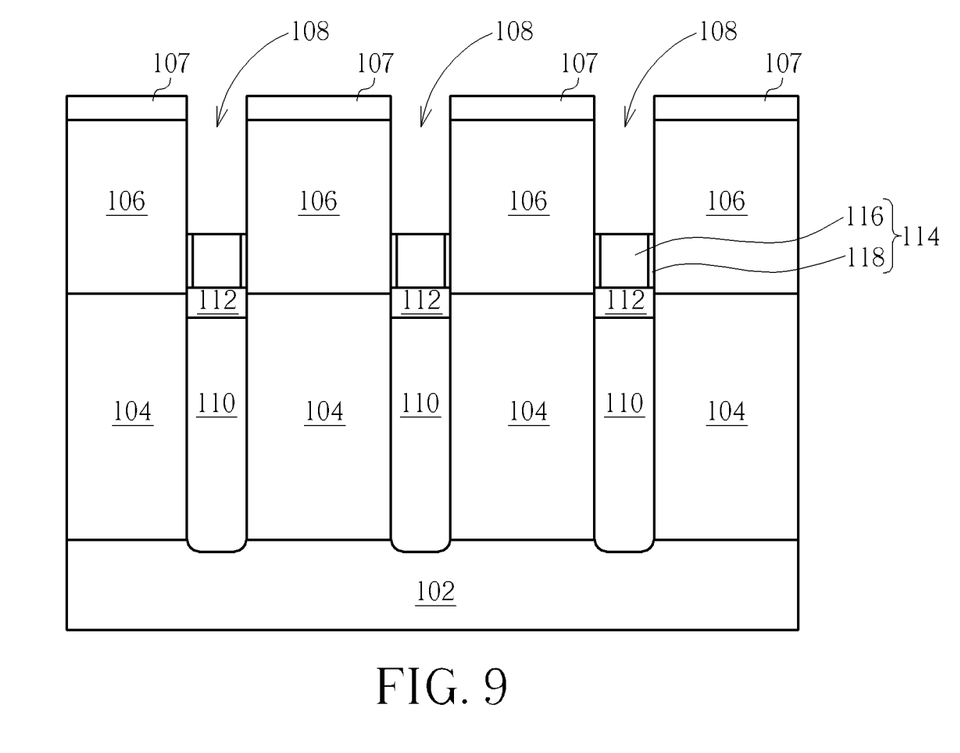

Afterwards, as shown in FIG. 9, a gate structure 114 is formed on the first insulating layer 112 in each through hole 108. The gate structure 114 may include a gate conductive layer 116 and a gate insulating layer 118 between the gate conductive layer 116 and P-type doped base region 106. In this embodiment, the step of forming the gate structure 114 may include first performing a thermal oxidation process to form an oxide layer on the exposed sidewall of the through hole 108, and then performing a third deposition process to form a conductive layer, such as a poly-silicon layer, on the first insulating layer 112 and the oxide layer in each through hole 108 and on the pad layer 107. Then, a third polishing and etching back process is performed to remove the conductive layer outside the through holes 108 and parts of the conductive layer inside the through holes 108, so that the gate conductive layer 116 is formed on the first insulating layer 112 in each through hole 108 and parts of the oxide layer are exposed. A fourth polishing and etching back process is then performed to remove the exposed oxide layer so that the gate insulating layer 118 is formed between the gate conductive layer 116 and the P-type doped base region 106 in each through hole 108. The gate insulating layer 118 is not limited to oxide layer. It may be made of any insulating material, such as nitride. Moreover, the step of forming gate structure 114 is not limited to the aforementioned method.

Figure 10:
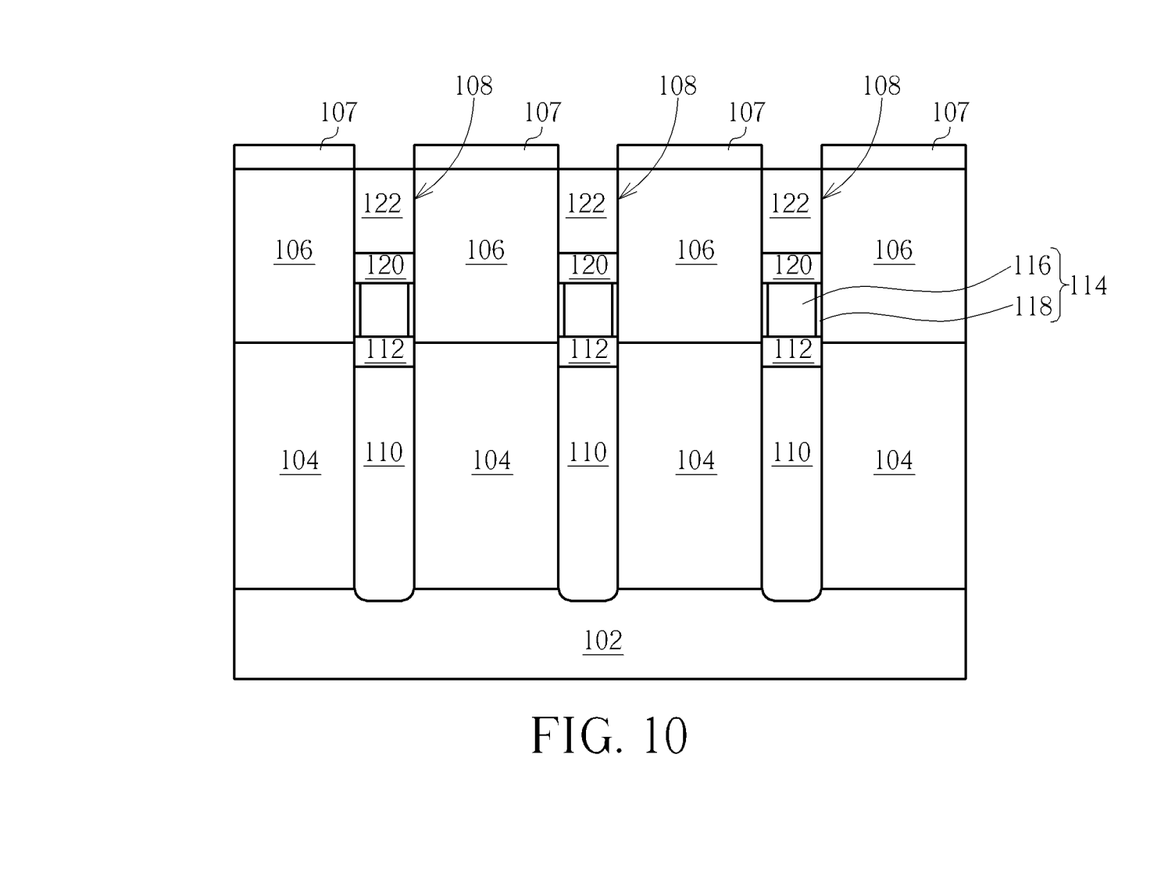

Then, as shown in FIG. 10, a fourth deposition process is performed to deposit an oxide layer on the P-type epitaxial layer 104 and the gate structure 114 and to fill up each through hole 108. A fifth polishing and etching back process is then performed to remove the oxide layer outside the through holes 108 and the parts of the oxide layer inside the through holes 108, so that parts of the sidewall of through holes 108 are exposed and a second insulating layer 120 is formed on the gate structure 114 in through holes 108, wherein the upper surface of the second insulating layer 120 is lower than the upper surface of P-type epitaxial layer 104. Then, a fifth deposition process is performed to form a second dopant source layer 122 on the upper surface of the pad layer 107 and the second insulating layer 120 and fill up the through holes 108, so that the second dopant source layer 122 may contact the P-type doped base region 106. A sixth polishing and etching back process is then performed to remove the second dopant source layer 122 outside of the through holes 108 until the upper surface of the second dopant source layer 122 levels with or is slightly lower than the P-type epitaxial layer 104. In this embodiment, the second dopant source layer 122 may include, but not limited to, a plurality of N-type second dopants, while the material used to form the second dopant source layer 122 may include arsenic silicate glass (ASG) or phosphor silicate glass (PSG). Moreover, the material used to form the second insulating layer 120 in the present invention is not limited to oxide. It may be any insulating material, such as nitride.

Figure 11:
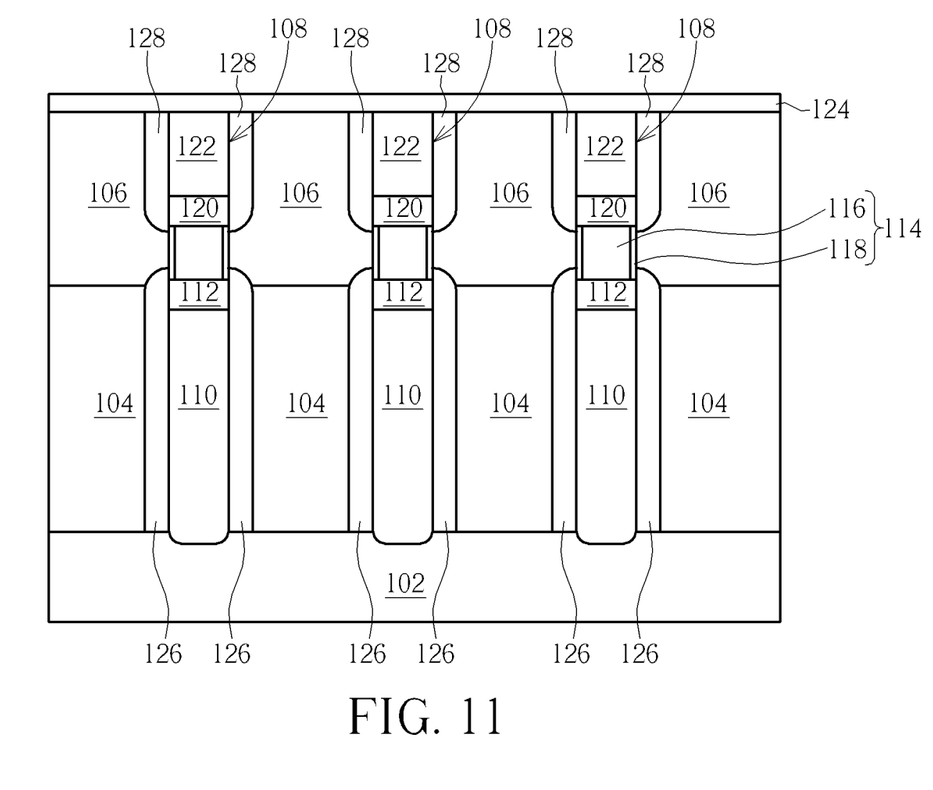

Then, as shown in FIG. 11, the pad layer 107 is removed and a liner layer 124 is covered on the P-type epitaxial layer 104 and the second dopant source layer 122. A second thermal drive-in process is then performed to diffuse the N-type first dopants in the first dopant source layer 110 of each through hole 108 into the P-type epitaxial layer 104, so that an N-type doped drain region 126 is formed in the P-type epitaxial layer 104 at both sides of the through holes 108 and the N-type second dopants in the second dopant source layer 122 are diffused into the P-type doped base region 106, thereby forming an N-type doped source region 128 in the P-type doped base region 106 at both sides of the through holes 108. In this embodiment, the material used to form the liner layer 124 may be any insulating material, such as oxide or nitride. Moreover, the N-type doped drain region 126 and N-type doped source region 128 may have different doping concentrations. This feature may be obtained, but not limited to, by adjusting the N-type first doping concentration in the first dopant source layer 110 and the N-type second doping concentration in the second dopant source layer 122. Each N-type doped drain region 126 contacts the P-type doped base region 106 thereon and the N-type substrate 102 under the N-type doped drain region 126. In this manner, the N-type doped drain region 126 may serve as the drain of the power transistor device 100. Each N-type doped source region 128 is disposed in the P-type doped base region 106 on the N-type doped drain region 126 and may serve as the source of the power transistor device 100. The gate structure 114 is disposed in the through hole 108 between the N-type doped drain region 126 and the corresponding N-type doped source region 128 and may serve as the gate of the power transistor device 100. The P-type doped base region 106 connected with each gate structure 114 may serve as the channel region of the power transistor device 100. Therefore, the power transistor device 100 in the present embodiment is a vertical trench-type power transistor device.

It is worth noting that in this embodiment, N-type second dopants diffused into the air during the second thermal drive-in process may be effectively prevented by covering the liner layer 124 on the P-type epitaxial layer 104 and the second dopant source layer 122. Besides, the N-type doped drain region 126 and P-type epitaxial layer 104 formed in the present invention may form a P-N junction (i.e. super junction) that is used for withstanding high voltage and is substantially perpendicular to the N-type substrate 102. Moreover, the voltage withstanding ability of the P-N junction depends on the depth of the P-N junction, so the height of formed first dopant source layer 110 may be adjusted by controlling the process condition of the first polishing and etching back process to obtain desired depth of the P-N junction and desired breakdown voltage for the power transistor device.

Figure 12:
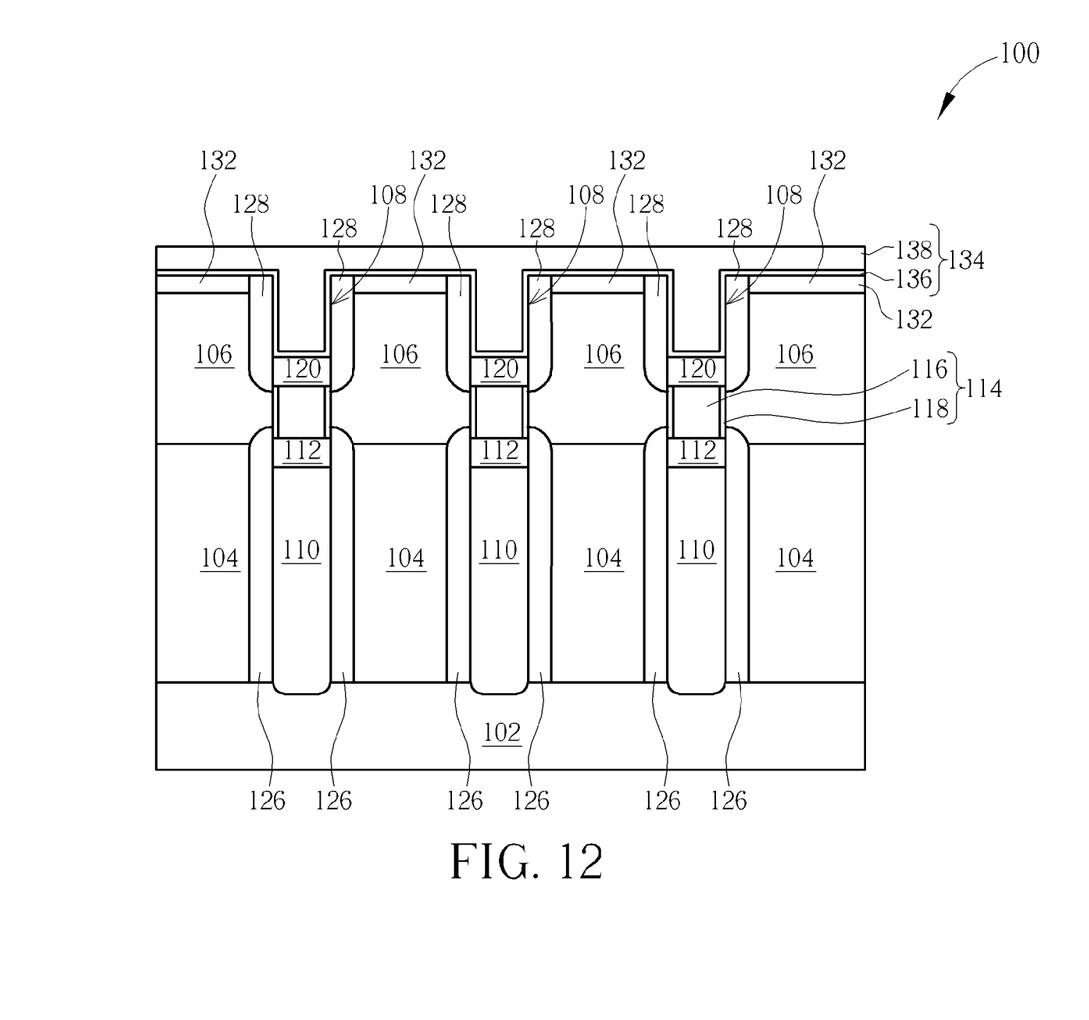

Afterward, as shown in FIG. 12, an etching process with high etching selectivity ratio of oxide with respect to silicon is performed to remove the liner layer 124 and the second dopant source layer 122 so as to expose the P-type doped base region 106, the N-type doped source region 128, and the second insulating layer 120. Then, a P-type second ion implantation process and a third thermal drive-in process is performed to form a P-type doped contact region 132 in the P-type doped base region 106 at one side of each N-type doped source region 128. A metal layer 134 is then formed on the P-type epitaxial layer 104 and the second insulating layer 120 which fills up the through holes 108, wherein the metal layer 134 may include a barrier metal layer 136 and a source metal layer 138. So far, the power transistor device 100 of this embodiment is completed. In this embodiment, the metal layer 134 not only contacts the N-type doped source region 128 on the upper surface of P-type epitaxial layer 104, but also extends into the through hole 108 to contact with the N-type doped source region 128 in the through hole 108, thereby effectively increasing the contact area of the metal layer 134 and the N-type doped source region 128 as well as reducing the source resistance of the power transistor device 100 to improve the ON-current of the power transistor device 100. Moreover, the P-type contact doped region 132 is electrically connected to the N-type doped source region 128 via the source metal layer 138. In another embodiment of the present invention, parts of the second dopant source are kept rather than being completely removed in etching processes. Alternatively, in addition to removing the second dopant source layer, the etching process may further remove parts of the second insulating layer.

In addition, the process flow of forming the metal layer 134 in this embodiment may include forming a barrier metal layer 136 first on the second insulating layer 120 and the P-type epitaxial layer 136, and then forming a source metal layer 138 on the barrier metal layer 136. In this order, the barrier metal layer 136 may prevent the metal in the source metal layer 138 from diffusing into the P-type epitaxial layer 104 and impacting the electrical properties of the power transistor device 100.

Therefore, the manufacturing method of power transistor device 100 in the present embodiment can use one single photomask to manufacture the power transistor device 100, thereby effectively reducing the number of necessary photomasks. The costs and the complexity of manufacturing the power transistor device 100 may be accordingly reduced. Furthermore, the power transistor device 100 of the present embodiment doesn't require a dielectric layer to isolate the metal layer 134 and the gate conductive layer 116, so the contact hole used to connect the metal layer 134 and the N-type doped source region 128 is unnecessary in the present embodiment. As a result, the spacing between adjacent through holes 108 may be further reduced, thereby shrinking the area of the power transistor device 100 without considering the space for contact holes.

The manufacturing method of the power transistor device of the present invention is not limited to the aforementioned embodiment. Alternative embodiments and modifications of present invention will be further disclosed hereafter. In order to simplify the description and highlight the differences between the embodiments or the modifications, similar reference numbers will be used to describe similar components and common steps will not be repeated again in the following paragraph.

Figure 13:
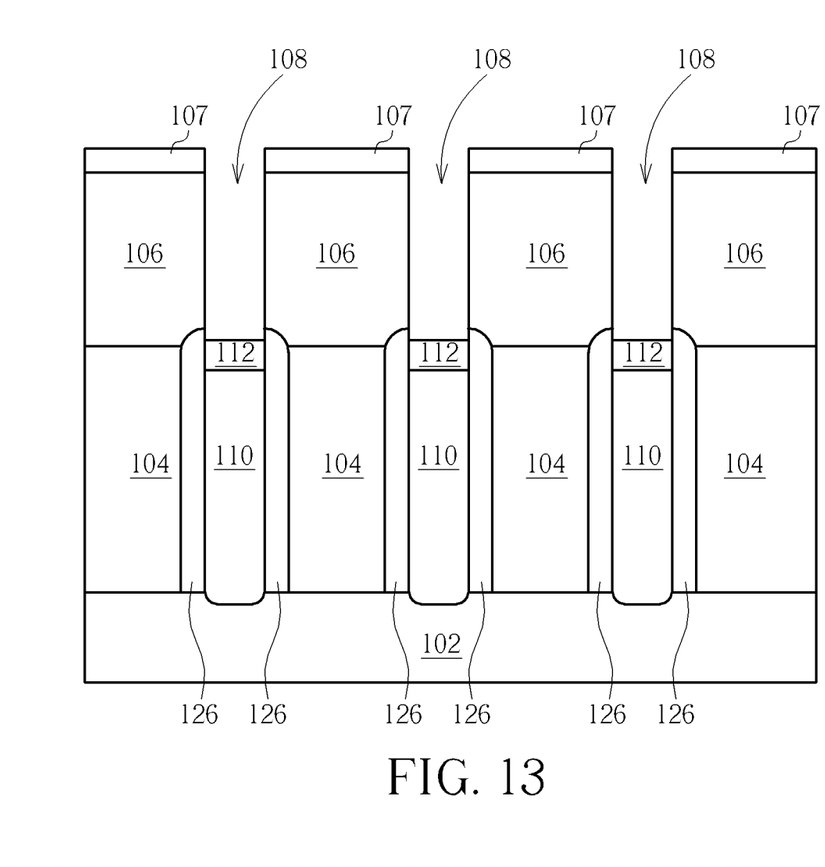
FIG. 13 is a schematic view illustrating the manufacturing method of a power transistor device in accordance with the second embodiment of present invention.

Please refer to FIG. 13, which is a schematic view illustrating the manufacturing method of a power transistor device in accordance with the second embodiment of the present invention. In comparison to the first embodiment, as shown in FIG. 13, the manufacturing method of the present embodiment further includes the step of performing a fifth thermal drive-in process between the step of forming the first insulating layer 112 and the step of forming the gate structure 114 to diffuse the N-type first dopants in the first dopant source layer 110 into the P-type epitaxial layer 104, thereby forming an N-type doped drain regions 126 in the P-type epitaxial layer 104 at both sides of the through holes 108. The N-type doped drain region 126 contacts the P-type doped base region 106 and the N-type substrate 102 and may serve as the drain of the power transistor device 100. Since the steps before forming the first insulating layer 112 (as shown in FIG. 7) and after forming the gate structure 114 (as shown in FIGS. 9-12) of the present embodiment are identical to those of the first embodiment, redundant detailed description is omitted herein. Besides, in other embodiments of the present invention, the N-type doped drain region 126 and the N-type doped source region 128 may have different diffusion concentrations and different diffusion widths, and the N-type doped drain region 126 and the N-type doped source region 128 can be formed in different thermal drive-in processes to adjust the diffusion concentrations and different diffusion widths of the N-type doped drain region 126 and the N-type doped source region 128.

To summarize, the present invention uses only one single photomask to form through holes and utilizes deposition processes and polishing and etching back processes to form the first dopant source layer, the first insulating layer, the gate structure, the second insulating layer, and the second dopant source layer in each through hole. With additional thermal drive-in processes, a vertical trench-type power transistor device is obtained in the present invention, which may effectively reduce the number of necessary photomasks and lower the costs and complexity for manufacturing the power transistor device. Moreover, the spacing between the through holes may be further reduced, thereby shrinking the area of the power transistor device without considering the space for contact holes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power transistor device, comprising:
   a substrate of a first conductive type;
   an epitaxial layer of a second conductive type on said substrate and having at least one through hole through said epitaxial layer;
   a doped base region of said second conductive type in said epitaxial layer;
   a dopant source layer in said through hole;
   a doped drain region of said first conductive type in said epitaxial layer at one side of said dopant source layer and contacting said substrate;
   a first insulating layer on said dopant source layer in said through hole;
   a gate structure on said first insulating layer in said through hole;
   a second insulating layer on said gate structure in said through hole;
   a doped source region of said first conductive type in said doped base region on said doped drain region, wherein said gate structure is between said doped source region and said doped drain region and contacts said doped base region; and
   a metal layer on said epitaxial layer extending into said through hole to contact said doped source region.

2. The power transistor device according to claim 1, further comprising a doped contact region of said second conductive type in said doped base region at one side of said doped source region.

3. The power transistor device according to claim 1, wherein said gate structure comprises:
   a gate conductive layer; and
   a gate insulating layer between said gate conductive layer and said epitaxial layer.

4. The power transistor device according to claim 1, wherein said metal layer comprises a barrier metal layer and a source metal layer.

* * * * *